United States Patent [19]

Fenk

[11] Patent Number: 5,144,263
[45] Date of Patent: Sep. 1, 1992

[54] METHOD FOR AMPLITUDE CONTROL OF AN OSCILLATOR OUTPUT SIGNAL, AND CIRCUIT CONFIGURATION FOR PERFORMING THE METHOD

[75] Inventor: Josef Fenk, Eching/Ottenburg, Fed. Rep. of Germany

[73] Assignee: Siemens Aktiengesellschaft, Munich, Fed. Rep. of Germany

[21] Appl. No.: 717,988

[22] Filed: Jun. 20, 1991

[30] Foreign Application Priority Data

Jun. 20, 1990 [EP] European Pat. Off. ........ 90111680.6

[51] Int. Cl.$^5$ ............................................. H03L 5/00
[52] U.S. Cl. ................................. 331/109; 331/117 R
[58] Field of Search ................... 331/109, 117 R, 167, 331/177 R

[56] References Cited

U.S. PATENT DOCUMENTS

| | | | |
|---|---|---|---|
| 4,588,968 | 5/1986 | Wile | 331/109 |
| 4,843,348 | 6/1989 | Fenk | 331/109 |
| 4,847,567 | 7/1989 | Fenk | 331/109 X |

FOREIGN PATENT DOCUMENTS

| | | |
|---|---|---|
| 0299464 | 1/1989 | European Pat. Off. |
| 2803430 | 8/1979 | Fed. Rep. of Germany |

*Primary Examiner*—Robert J. Pascal
*Attorney, Agent, or Firm*—Herbert L. Lerner; Laurence A. Greenberg

[57] ABSTRACT

An oscillator includes at least one oscillator transistor having collector, emitter and base leads, a controllable current source connected between the emitter lead of the at least one oscillator transistor and a supply potential, and a frequency-determining element, such as an oscillating circuit, connected at least to the base or collector lead of the at least one oscillator transistor. A method for controlling the amplitude of the output signal of the oscillator includes supplying a direct voltage variation at the emitter lead of the at least one oscillator transistor resulting from a change in amplitude of a signal applied to the base lead of the at least one oscillator transistor as a controlled variable for the current of the controllable current source. The oscillator may also include a control amplifier. The emitter lead of the at least one oscillator transistor is connected to one input of the control amplifier and the other input of the control amplifier is connected to a reference potential. The reference potential is in a fixed relationship with a direct signal component of a signal present at the base lead of the at least one oscillator transistor. The current of the controllable current source is adjusted as a function of an output variable at the control amplifier.

10 Claims, 2 Drawing Sheets

METHOD FOR AMPLITUDE CONTROL OF AN OSCILLATOR OUTPUT SIGNAL, AND CIRCUIT CONFIGURATION FOR PERFORMING THE METHOD

The invention relates to a method for controlling the amplitude of the output signal of an oscillator, which has at least one oscillator transistor having an emitter lead connected to a supply potential through a controllable current source, the oscillator having a frequency-determining element, such as an oscillating circuit, connected at least to the base lead or the collector lead of at least one of the oscillator transistors, wherein a change in amplitude of the signal applied to the base lead of at least one of the oscillator transistors is stabilized by varying the current of the controllable current source. The invention also relates to a circuit configuration for performing such a method.

Among other aspects, the invention is important for oscillators with tuning diodes in the frequency-determining resonant circuit. Due to a relatively major change in quality over the frequency, such oscillators typically have an amplitude response of approximately 10 to 15 dB, if the amplitude of the oscillator amplifier is not controlled. For an oscillator amplifier with a predetermined frequency bandwidth, if the current impressed upon the oscillator amplifier is adjusted in such a way that the oscillator has adequate security against oscillation at the lower end of the band, then the result is an overly large oscillation amplitude at the upper end of the band. That can interfere with the radiation performance. If such an oscillator amplifier is monolithically integrated, then problematically high amplitudes can occur at the outer leads of the operational amplifier, to which leads the oscillating circuit may, for instance, be coupled. Moreover, if the oscillator transistors operate in the saturation mode in a portion of the frequency band of the oscillator, then substrate currents can flow, which may create interference.

One type of prior art circuit is described in detail below in the detailed description of FIG. 1. In such a circuit configuration, additional elements, namely a controller or rectifier, are connected to critical points of the oscillator amplifier circuit with respect to the high-frequency signal, in the case of FIG. 1 to the base lead of the oscillator transistor. Such additional elements entail additional parasitic capacitances, which affect the upper limit frequency of such an oscillator circuit.

Another form of embodiment of an amplitude-controllable oscillator amplifier circuit is shown in Published European Application No. 0 299 464 A1, corresponding to U.S. Pat. No. 4,843,348. FIG. 1 of those publications, in particular, show an oscillator circuit of the kind described in the aforementioned prior art. However, the control amplifier acting as a rectifier is not connected to the base leads of the oscillator transistors T1 and T2 but rather is connected to the collector lead of the second transistor T2. In the circuit according to Published European Application No. 0 299 464 A1, corresponding to U.S. Pat. No. 4,843,348, the emitter current of the oscillator amplifier circuit is likewise varied as a function of the alternating signal of the oscillator amplifier through a control circuit. Although in such a circuit, known from Published European Application No. 0 299 464 A1, corresponding to U.S. Pat. No. 4,843,348, it is possible to operate the oscillator amplifier with symmetrical triggering, nevertheless in such circuits as well, additional elements, such as the controller, are connected to critical points for the alternating signal, in that case to the collector lead of the oscillator transistor T2. Once again, the additional parasitic capacitances have a negative effect on the upper limit frequency of such an oscillator. Moreover, in circuit configurations according to Published European Application No. 0 299 464 A1, corresponding to U.S. Pat. No. 4,843,348, a controller in the form of a peak-value rectifier with an additional capacitor is also necessary.

It is accordingly an object of the invention to provide a method for amplitude control of an oscillator amplifier output signal, and a circuit configuration for performing the method, which overcome the hereinafore-mentioned disadvantages of the heretofore-known methods and devices of this general type and in which critical points for the alternating voltage performance of the oscillator circuit are not burdened by additional parasitic elements.

With the foregoing and other objects in view there is provided, in accordance with the invention, a method for controlling the amplitude of the output signal of an oscillator including at least one oscillator transistor having collector, emitter and base leads, a controllable current source connected between the emitter lead of the at least one oscillator transistor and a supply potential, and the oscillator having a frequency-determining element, such as an oscillator circuit, connected at least to the base or collector lead of at least one of the oscillator transistors, which comprises supplying a direct voltage variation at the emitter lead of at least the one oscillator transistor resulting from a change in amplitude of a signal applied to the base lead of at least one of the oscillator transistors as a controlled variable for the current of the controllable current source.

In accordance with another feature of the invention, the at least one oscillator transistor is one oscillator transistor, a capacitor is connected parallel to the controllable current source between the emitter lead of the one oscillator transistor and the supply potential, and the frequency-determining element is connected at least to the base lead of the one oscillator transistor, which comprises supplying a direct voltage variation at the emitter lead of the one oscillator transistor resulting from a change in amplitude of a signal applied to the base lead of the one oscillator transistor as a controlled variable for the current of the controllable current source.

In accordance with a further feature of the invention, the at least one oscillator transistor is at least two oscillator transistors having emitter leads connected to the supply potential through the controllable current source, and the frequency-determining element is at least one frequency-determining element connected to the base lead of at least one of the oscillator transistors and to the collector lead of the other of the oscillator transistors, which comprises supplying a direct voltage variation at the emitter leads of the oscillator transistors resulting from a change in amplitude of a signal applied to the base lead of at least one of the oscillator transistors as a controlled variable for the current of the controllable current source.

With the objects of the invention in view, there is also provided an oscillator amplifier circuit configuration with a control circuit for controlling the amplitude of the output signal of an oscillator, comprising at least one oscillator transistor having collector, emitter and base leads, a control amplifier having two inputs and an output, the emitter lead of the at least one oscillator transistor being connected to one of the inputs of the control amplifier, the other of the inputs of the control amplifier being connected to a reference potential, means for maintaining the reference potential in fixed relationship with a direct signal component of a signal present at the base lead of the at least one oscillator transistor, a controllable current source connected between the emitter lead of the at least one oscillator transistor and a supply potential, the controllable current source having a current being adjusted as a function of an output variable at the output of the control amplifier, and a frequency-determining element, such as an oscillating circuit, connected to the base or collector lead of the at least one oscillator transistor.

For methods of amplitude control according to the invention, it is essential that in oscillator amplifiers having an emitter current impressed by a controllable current source, the relative variation of the voltage level at the emitter lead of the oscillator transistor T1 be used a the controlled variable for this controllable current source. As a result, no additional peak-value rectifier, which furnishes a controlled variable as a function of the signal amplitude at the base lead of the oscillator transistor T1, is needed. Due to the rectifier effect of the base-emitter diode of the oscillator transistor T1, the voltage at the emitter lead of the oscillator transistor varies relative to the direct signal component of the voltage at the base lead of the oscillator transistor, as a function of the amplitude of the alternating signal at the bas lead of the oscillator transistor. The same is also true if more than one oscillator transistor T1 is provided.

One essential advantage of circuit configurations according to the invention is that no additional circuit elements and thus no additional parasitic capacitances are necessary in the region of the collector and base of oscillator transistors, in order to derive the controlled variable for amplitude control.

Other features which are considered as characteristic for the invention are set forth in the appended claims.

Although the invention is illustrated and described herein as embodied in a method for amplitude control of an oscillator output signal and a circuit configuration for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
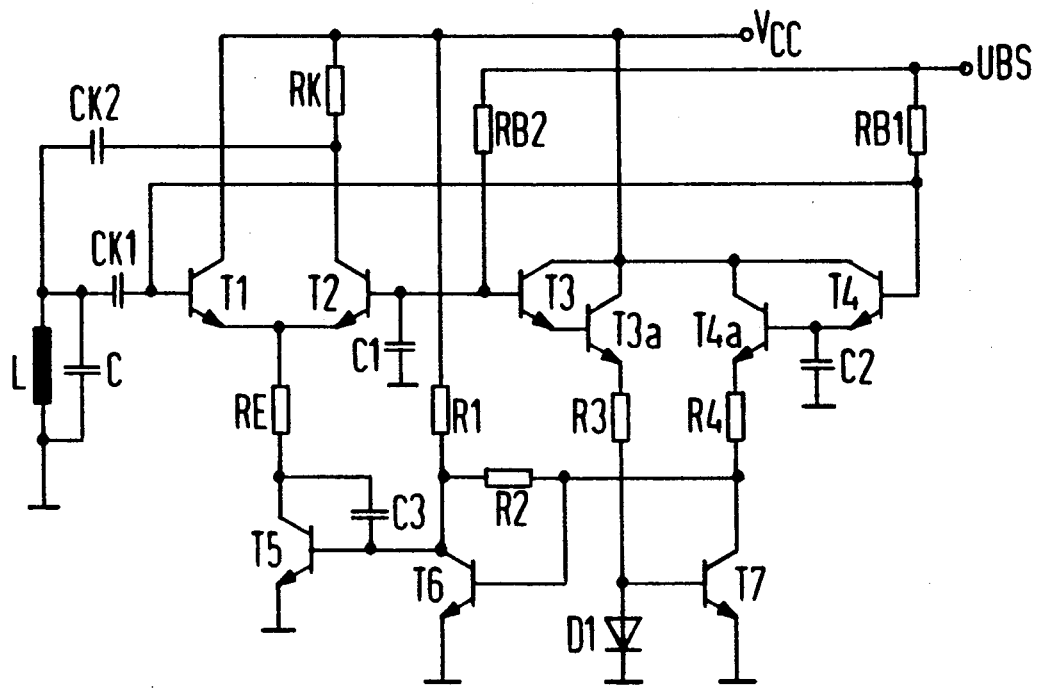
FIG. 1 is a schematic circuit configuration of an oscillator circuit.

Referring now to the figures of the drawing in detail and first, particularly, to FIG. 1 thereof, there is seen a basic circuit diagram of an oscillator circuit, in which a generic method for amplitude control of the oscillator output signal is used. Such an oscillator circuit may, for instance, be found in the commercially available TDA 5230 integrated circuit. FIG. 1 shows first and second oscillator transistors T1 and T2, having emitter leads which are interconnected with one another. The base lead of the second transistor T2 is interconnected with the base lead of a third transistor T3. The base lead of the first transistor T1 is interconnected with the base lead of a fourth transistor T4. The emitter lead of the third transistor T3 is connected to the base lead of a further transistor T3a, while the emitter lead of the fourth transistor T4 is connected to the base lead of a further transistor T4a. The collector leads of the transistors T3, T3a, T4 and T4a are connected in common to a first supply potential $V_{CC}$, so that the transistor T3 plus the transistor T3a, like the transistor T4 plus the transistor T4a, can be considered like a transistor with high current amplification, in terms of their functioning.

The base leads of the first and fourth transistors T1 and T4 are connected through a so-called bias resistor RBI to a so-called bias potential UBS, and the base leads of the transistors T2 and T3 are likewise connected to the bias potential UBS through a further bias resistor RB2. Through the use of this bias potential UBS and these bias resistors RB1, RB2, the operating points of the transistors T1, T2, T3, T3a, T4 and T4a are adjustable as a function of the impressed emitter current. The base lead of the first transistor T1 is connected through a coupling capacitor CK1, and the collector lead of the second transistor T2 is connected through a further coupling capacitor CK2, to one lead of a parallel oscillating circuit provided by a capacitor C and a inductive resistor L, while the other lead of this parallel oscillating circuit is connected to a reference potential, such as ground. The collector lead of the second transistor T2 is connected to the first supply potential $V_{CC}$ through a collector resistor RK. The collector lead of the first transistor T1 in FIG. 1 is connected directly to this first supply potential $V_{CC}$, but it is also possible to provide one or more p-n junctions between the collector lead of the first transistor and the first supply potential $V_{CC}$. The base lead of the second transistor T2 and thus the base lead of the third transistor T3 are connected to reference potential or ground, by alternating voltage through a capacitor C1.

The emitter leads of the first and second transistor T1 and T2 are connected through a resistor RE to the collector lead of a transistor T5 having an emitter lead which is connected to reference potential or ground. A capacitor C3 connected in FIG. 1 between the collector and the base leads of the transistor T5 is necessary for the operation of the circuit, but as needed it may already be provided by the Miller capacitor of this transistor T5. Together with the resistor RE, the transistor T5 forms a controllable current source. The base lead of the transistor T5 is interconnected with the collector lead of a transistor T6 having an emitter lead which is connected to reference potential or ground. The collector lead of this transistor T6 is connected to the first supply potential $V_{CC}$ through a resistor R1 and to the base lead of the transistor T6 through a resistor R2. In the circuit shown in FIG. 1, the transistor T6 acts as an inverter. The base lead of the transistor T6 is connected to the collector lead of a transistor T7 having an emitter lead which is connected to reference potential or ground.

The base lead of this transistor T7 is interconnected to the anode of a diode D1 having a cathode which is connected to reference potential. The diode D1 and the transistor T7 act as a current mirror circuit. The base lead of the transistor T7 is also connected to the emitter lead of the transistor T3a through a resistor R3, and the collector lead of the transistor T7 is also connected to the emitter lead of the transistor T4a, through a resistor R4. The emitter lead of the transistor T4 is connected to the reference potential or ground, through a capacitor C2 and thus is connected by alternating voltage to ground. The circuit configuration including the transistors T3, T3a, T4, T4a and T7 along with the diode D1 form a control amplifier. The transistor T4 in this case is connected as an emitter follower and acts as a peak-value rectifier. The control signal furnished by this current configuration at the base lead of the transistor T6 functioning as an inverter is directly related to the signal amplitude furnished at the base lead of the first transistor T1 of the alternating voltage signal. The amplitude of the output signal of the oscillator circuit formed by the oscillator transistors T1 and T2 and the current source constructed by the resistor RE and the transistor T5 depends on one hand on the trigger signal present at the base lead of the first transistor T1 and on the other hand on the current impressed by the current source T5, RE. In circuits according to FIG. 1, the signal furnished by the peak value rectifier T4 increases with an increasing trigger signal at the base lead of the transistor T1, so that the current of the controllable current source RE, T5 is limited by interposing an inverter T6.

In such circuits as described above, it is absolutely necessary for the base lead of the transistor T2 and the base lead of the transistor T3 to be connected through an alternating signal to the reference potential or ground, through a capacitor C1. With such amplifier circuits, it is accordingly not possible to operate an oscillator with symmetrical triggering of the transistors T1 and T2. That is, if the base lead of the transistor T2 is not connected through an alternating signal to the reference potential or ground, then the rectifier circuit including the transistors T3 and T4 cannot furnish any signal-dependent differential voltage. Moreover, in circuit configurations according to FIG. 1, one additional capacitor C2 is necessary in the rectifier.

In a circuit configuration of FIG. 1, additional elements, namely the controller or rectifier, are connected to critical points of the oscillator amplifier circuit with respect to the high-frequency signal, in this case to the base lead of the oscillator transistor T1. These additional elements entail additional parasitic capacitances, which affect the upper limit frequency of such an oscillator circuit.

Figure 2:
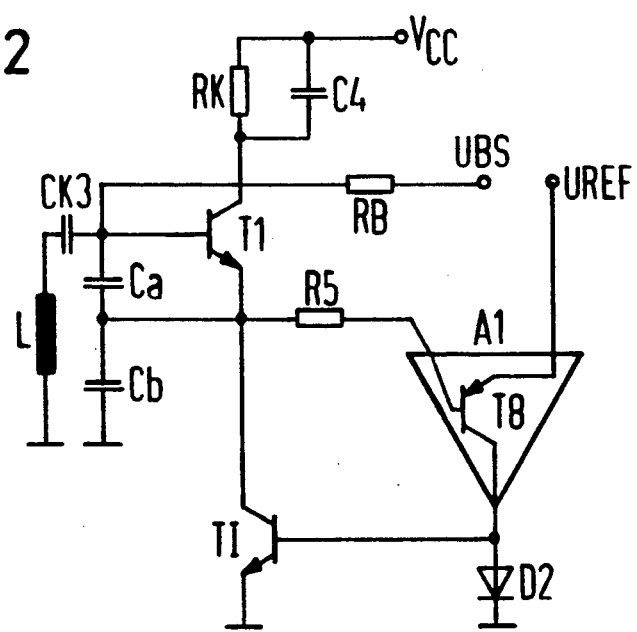
FIG. 2 is a basic circuit diagram of an especially simple exemplary embodiment of an oscillator circuit for carrying out methods for controlling the output signal amplitude according to the invention.

FIG. 2 shows an oscillator transistor T1 having a base lead which is connected to a supply potential, in this case the reference potential or ground, through an inductive resistor L. The base lead of the transistor T1 is also connected to its emitter lead through a capacitor Ca, as well as to a bias potential UBS through a bias resistor RB which is required for setting the operating point. A coupling capacitor CK3 which is provided between the base lead of the oscillator transistor T1 and the inductive resistor L decouples this base lead from ground in terms of direct voltage. The collector lead of the oscillator transistor T1 is connected through a resistor RK to a first supply potential $V_{CC}$, and the collector lead of the oscillator transistor T1 is also connected in terms of alternating current to this first supply potential $V_{CC}$ through a capacitor C4. The emitter lead of the oscillator transistor T1 is connected to the reference potential or ground through a capacitor Cb, it is interconnected to the collector lead of a transistor TI, and it is also connected to one input of a control amplifier A1 through a resistor R5. The other input of the control amplifier A1 is acted upon by a reference potential UREF. The output lead of the control amplifier A1 is connected to the cathode lead of a diode D2, having an anode lead which is connected to the reference potential or ground. Moreover, the output lead of the control amplifier A1 is connected to the base lead of the transistor T1. The emitter lead of the transistor T1 is connected to the reference potential or ground. A pnp transistor T8 is shown as a particularly simple exemplary embodiment of the control amplifier A1. The base lead of the transistor T8 forms one input of the control amplifier, its emitter lead forms the other input of the control amplifier, and its collector lead forms the output of the control amplifier. With the series circuit including the capacitors Ca and Cb, the inductive resistor L forms a parallel oscillating circuit. This parallel oscillating circuit determines the frequency of a signal that is incited because of the feedback effected from the emitter lead of the transistor T1 through a capacitor Ca to the base lead of this transistor T1 and is superimposed, at the base lead of this transistor T1, on the direct voltage required for setting the operating point. The direct voltage, which is present at the base lead of the transistor T1, brings about a direct voltage at the emitter lead of this transistor T1 that is lower by the amount of a diode conduction voltage. The alternating signal that is superimposed on the direct voltage at the base lead of the transistor T1 effects an additional direct voltage, because of the integrated action attained by suitable dimensioning of the capacitor Cb. In the absence of an alternating signal at the base lead of the oscillating transistor T1, this additional direct voltage is superimposed on the direct voltage present at the emitter lead of this transistor T1. This additional direct voltage is directly dependent on the amplitude of the alternating signal at the base lead of the oscillator transistor T1.

The output variable of the control amplifier A1 is varied in proportion to the reference potential UREF as a function of the variation in the direct voltage level at the emitter lead of the first transistor T1. The reference potential UREF should be in a fixed relationship with the direct voltage level present at the base lead of the oscillator transistor T1 for the purpose of setting the operating point of this oscillating transistor T1. It is only then that a variation in the amplitude of the alternating signal at the base lead of the oscillator transistor T1 can be definitively associated with a variation in the direct voltage at the emitter lead of the oscillator transistor T1. If the direct voltage level at the base lead of the oscillator transistor T1 is kept at a fixed potential by a bias circuit, then it suffices if the reference potential UREF is likewise fixed. In the basic circuit shown in FIG. 2, the control amplifier A1 impresses a fixed current upon the current mirror circuit constructed of the transistor TI and the diode D2.

Since the signal of the oscillator of FIG. 2 can be adjusted on one hand by the impressed emitter current of the transistor T1 and on the other hand by the alternating signal present at the base lead of this oscillator transistor T1, an amplitude control is attained in the circuit shown by providing that with an increasing signal amplitude of the base lead of the oscillator transistor T1, the emitter current of this oscillator transistor T1 is reduced to a corresponding extent.

Figure 3:
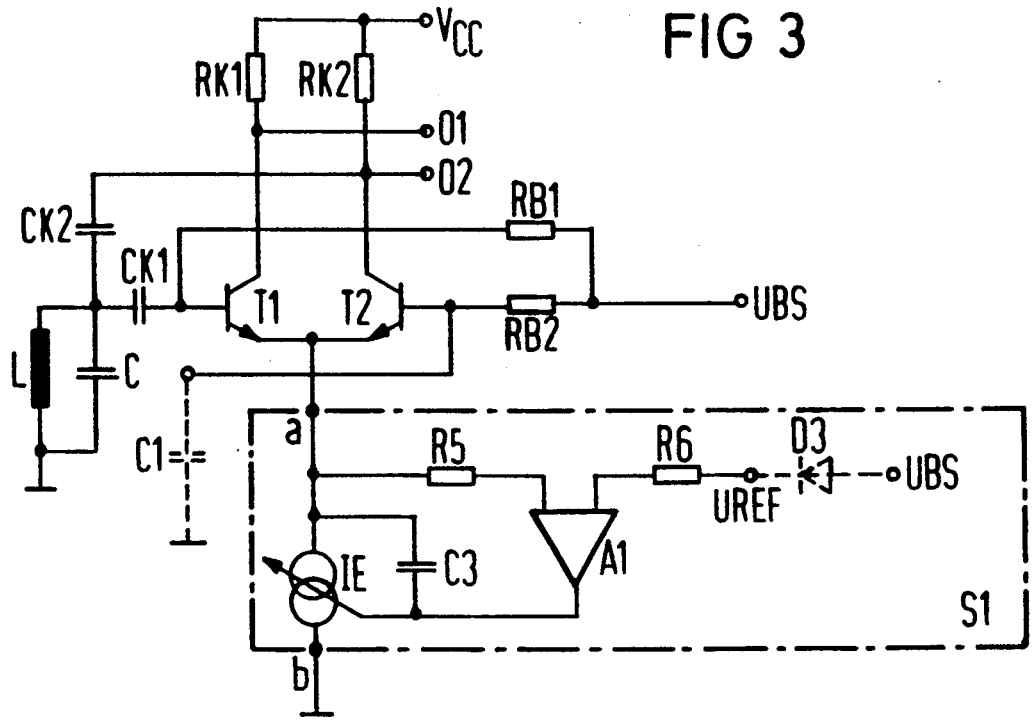
FIG. 3 is a circuit diagram of a particularly advantageous exemplary embodiment of an oscillator circuit for carrying out a method for controlling the output signal amplitude according to the invention.

FIG. 3 shows an oscillator amplifier circuit with a first oscillator transistor T1 and a second oscillator transistor T2, having emitter leads which are connected to one another. The collector lead of the first oscillator transistor T1 is connected to a connection terminal 01 and is connected to a first supply potential $V_{CC}$ through a collector resistor RK1. The collector lead of the second oscillator transistor T2 is connected to a connection terminal 02 and through a collector resistor RK2 to the first supply potential $V_{CC}$. The base lead of the first oscillator transistor is connected to a bias potential UBS through a bias resistor RB1. The base lead of the second oscillator transistor T2 is likewise connected to this bias potential UBS through a further bias resistor RB2. The frequency-determining element provided in FIG. 3 is a parallel oscillating circuit constructed of an inductive resistor L and a capacitor C connected parallel thereto. One lead of this parallel oscillating circuit is connected to the reference potential or ground. The other lead of this parallel oscillating circuit is connected on one hand, through a first coupling capacitor CK1 to the base lead of the first oscillator transistor T1 and on the other hand, through second coupling capacitor CK2 to the connection terminal 02 and thus to the collector lead of the second oscillator transistor T2. In FIG. 3, the base lead of the second oscillator transistor T2 is connected to the reference potential through a capacitor C1 shown in broken lines. This variant circuit is employed if the oscillator amplifier is asymmetrically triggered. The oscillator amplifier can equally well be triggered symmetrically, and to this end a further oscillating circuit is necessary, which has an inductive resistor corresponding to the inductive resistor L and a capacitor corresponding to the capacitor C. This oscillating circuit would then have to be connected through a coupling capacitor corresponding with the coupling capacitor CK1, to the base lead of the second oscillator transistor T2, and would also have to be connected to the connection terminal 01 and thus to the collector lead of the first oscillator transistor T1, through a capacitor corresponding to the coupling capacitor CK2.

The emitter leads of the oscillator transistors T1 and T2 are connected to a connection terminal a of a circuit element S1 that is connected by a connection terminal b to the reference potential or ground. The circuit element S1 includes a controllable current source IE, which impresses a current between the connection terminal a and the connection terminal b. The control input of the current source IE is interconnected with the output of a differential amplifier A1 that is provided as a control amplifier. An operational amplifier with a differential amplifier input may also be provided as this differential amplifier A1. A capacitor C3 which is provided between the control input of the current source IE and the connection terminal a, prevents the controller constructed of the control amplifier A1 from tending to relaxation oscillation. In order to achieve a closed control loop, one signal input of the differential amplifier A1 is connected through a resistor R5 to the connection terminal a. The other signal input of the differential amplifier A1 is connected through a resistor R6 to a circuit node acted upon by a reference potential UREF. The reference potential URE in this case may in particular be derived from the bias potential UBS in such a manner that one or more p-n junctions, for instance in the form of a diode D3, are provided between the bias potential UBS and the circuit node carrying the reference potential UREF.

In the oscillator shown in FIG. 3, the first oscillator transistor T1 is operated as an emitter circuit and the second oscillator transistor T2 is operated as a base circuit, for the purposes of the operator action. The circuit element S1 has a closed-loop control circuit with the current source IE as its final control element. The effective capacitances and resistances in this closed-loop control circuit should advantageously be selected in such a way that the closed-loop control circuit is not operative in the range of the set-point frequency of the oscillator circuit. Any change in the signal trigger level at the base leads of the oscillator transistors T1 and T2 is passed on to the emitter lead and thus to the connection terminal a through the base-to-emitter p-n junctions. The potential at the connection terminal a furnishes an actual value through the resistor R5 to one signal input of the differential amplifier A1 used as the control amplifier. The signal output of this control amplifier varies the current of the current source IE flowing between the connection terminal a and the connection terminal b until the potential at the connection terminal a is adapted to a set-point value predetermined by the reference potential UREF.

Figure 4:
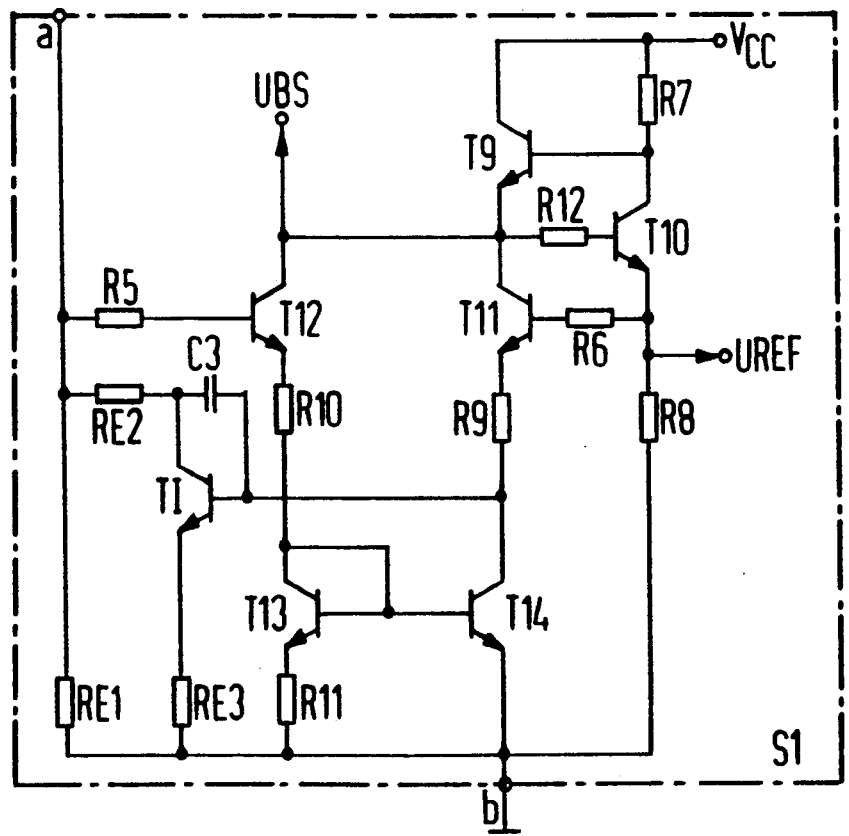
FIG. 4 is a circuit diagram of a particularly advantageous exemplary embodiment for achieving a circuit element S1 shown in FIG. 3 in the form of a basic circuit diagram.

FIG. 4 shows a particularly advantageous exemplary embodiment for constructing a circuit element S1 which is shown in FIG. 3 in the form of a basic circuit diagram. The circuit shown in FIG. 4 also generates a bias potential UBS and a reference potential UREF from a supply potential $V_{CC}$. The current source indicated by reference symbol IE in FIG. 3 is constructed of three current source resistors RE1, RE2 and RE3, as well as one current source transistor TI, in FIG. 4. The resistor RE1 is connected between the connection terminal a and the connection terminal b. One lead of the resistor RE2 is connected to the connection terminal a. The other lead of the resistor RE2 is connected to the collector lead of the current source transistor TI as well as through a capacitor C3 to the base lead of the current source transistor TI. The emitter lead of the current source transistor TI is connected through the resistor RE3 to the connection terminal b. The capacitor C3 in FIG. 4 is equivalent in its action to the capacitor C3 in FIG. 3. The current source resistor RE1 defines the minimum current flowing through the current source IE, as a function of the voltage applied to the connection terminals a and b. This current can be increased as a function of the triggering of the current source transistor T1. The maximum current allowed by the current source IE is defined as a function of the voltage applied to the connection terminals a and b by the parallel circuit of the resistor RE1 and the sum of the resistors RE2 and RE3.

The collector lead of a transistor T9 is connected to the supply potential $V_{CC}$. The base lead of this transistor T9 is likewise connected through a resistor R7 to the supply potential $V_{CC}$ and is also interconnected with the collector lead of a transistor T10. The emitter lead of the transistor T9 serves to furnish the bias potential UBS and is connected to the base lead of the transistor T10, among other elements, through a resistor R12. The emitter lead of the transistor T10 serves to furnish the reference potential UREF and is connected to the reference potential or ground, through a resistor R8. Both the transistor T9 and the transistor T10 are operated as emitter follower circuits. The bias potential UBS is thus below the potential applied to the base of this transistor T9, by the amount of the base-to-emitter voltage of the transistor T9. This potential is less than the supply potential $V_{CC}$ by the voltage formed of the product of the resistance of the resistor R7 and the sum of the base current of the transistor T9 and the collector current of the transistor T10. The reference potential UREF is below the bias potential UBS by the base-to-emitter voltage of the transistor T10. Thus at a given supply potential $V_{CC}$, taking into account the base-to-emitter voltages of the transistors T9 and T10, the base potential UBS is adjustable by a suitable selection of the resistances of the resistors R7 and R8. In FIG. 4, a circuit element corresponding to the control amplifier A1 in FIG. 3 is constructed of transistors T11 and T12 having collector leads which are connected to the bias potential UBS. The base lead of the transistor T12 forms one signal input of the control amplifier and is connected to the connection terminal a through the resistor R5. The base terminal of the transistor T11 forms the other control amplifier signal input and is connected through a resistor R6 to the circuit node furnishing the reference potential UREF. The emitter lead of the transistor T11 is connected to one lead of a resistor R9. The other lead of this resistor R9 represents the signal output of the control amplifier and is connected on one hand to the base lead of the current source transistor TI and on the other hand to the collector lead of the transistor T14. The emitter lead of the transistor T14 is connected to the connection terminal b and thus to ground. The emitter lead of the transistor T12 is connected through a resistor R10 both to the collector lead and to the base lead of a transistor T13 and to the base lead of a transistor T14. The emitter lead of the transistor T13 is connected to the connection terminal b through a resistor R11. The transistor T13 and the transistor T14 together with the resistor R11 form a current mirror circuit, which cooperates with the transistors T11 and T12 in such a manner that a change in the potential at the connection terminal a causes a variation in the emitter current of the transistor T12, thereby effecting a variation in the emitter current of the transistor T13 and also a variation of the emitter current of the transistor T14, so that the triggering of the current source transistor TI is thus varied as a function of a variation in the potential applied to the connection terminal a. The effective resistors and the effective capacitors, in particular the capacitor C3, should be dimensioned in this respect in such a way that the closed-loop control circuit is operative only in a desired frequency range.

The resistors RE3 and R11 shown in FIG. 4 may also be dispensed with, either individually or together. The control amplification, which can be adjusted by means of these resistors RE3 and R11 among others, can also be adjusted by providing that the emitter surface areas of the transistors T13 and T14 are of different sizes, and in particular that the emitter surface area of the transistor T14 is a multiple of the emitter surface are of the transistor T13.

I claim:

1. A method for controlling the amplitude of the output signal of an oscillator including at least one oscillator transistor having emitter and base leads, a controllable current source connected between the emitter lead of the at least one oscillator transistor and a supply potential, the current source being controllable by a controlled variable, and a frequency-determining element connected at least to the base lead of the at least one oscillator transistor, which comprises supplying a direct voltage variation at the emitter lead of the at least one oscillator transistor resulting from a change in amplitude of a signal applied to the base lead of the at least one oscillator transistor as the controlled variable for the current of the controllable current source.

2. The method according to claim 1, which comprises using an oscillating circuit as the frequency-determining element.

3. The method according to claim 1, wherein the at least one oscillator transistor is one oscillator transistor, a capacitor is connected parallel to the controllable current source between the emitter lead of the one oscillator transistor and the supply potential, and the frequency-determining element is connected at least to the base lead of the one oscillator transistor, which comprises supplying a direct voltage variation at the emitter lead of the on oscillator transistor resulting from a change in amplitude of a signal applied to the base lead of the one oscillator transistor as a controlled variable for the current of the controllable current source.

4. A method for controlling the amplitude of the output signal of an oscillator including at least one oscillator transistor having collector, emitter and base leads, a controllable current source connected between the emitter lead of the at least one oscillator transistor and a supply potential, the current source being controllable by a controlled variable, and a frequency-determining element connected at least to the collector lead of the at least one oscillator transistor, which comprises supplying a direct voltage variation at the emitter lead of the at least one oscillator transistor resulting from a change in amplitude of a signal applied to the base lead of the at least one oscillator transistor as the controlled variable for the current of the controllable current source.

5. The method according to claim 4, which comprises using an oscillating circuit as the frequency-determining element.

6. The method according to claim 4, wherein the at least one oscillator transistor is at least two oscillator transistors having emitter leads connected to the supply potential through the controllable current source, and the frequency-determining element is at least one frequency-determining element connected to the base lead of at least one of the oscillator transistors and to the collector lead of the other of the oscillator transistors, which comprises supplying a direct voltage variation at the emitter leads of the oscillator transistors resulting from a change in amplitude of a signal applied to the base lead of at least one of the oscillator transistors as a controlled variable for the current of the controllable current source.

7. An oscillator amplifier circuit configuration with a control circuit for controlling the amplitude of the output signal of an oscillator, comprising at least one oscillator transistor having collector, emitter and base leads, a control amplifier having two inputs and an output, the emitter lead of said at least one oscillator transistor being connected to one of the inputs of said control amplifier, the other of the inputs of said control amplifier being connected to a reference potential, means for maintaining the reference potential in a fixed relationship with a direct signal component of a signal present at the base lead of said at least one oscillator transistor, a controllable current source connected between the emitter lead of said at least one oscillator transistor and a supply potential, said controllable current source having a current being adjusted as a function of a output variable at the output of said control amplifier, and a frequency-determining element connected to said at least one oscillator transistor.

8. The oscillator amplifier circuit configuration according to claim 7, wherein said frequency-determining element is connected to the base lead of said at least one oscillator transistor.

9. The oscillator amplifier circuit configuration according to claim 7, wherein said frequency-determining element is connected to the collector lead of said at least one oscillator transistor.

10. The oscillator amplifier circuit configuration according to claim 7, wherein said frequency-determining element is an oscillating circuit.

* * * * *